(12) United States Patent
Nakaoka

(10) Patent No.: US 11,004,533 B2
(45) Date of Patent: May 11, 2021

(54) MEMORY DEVICE AND BUILT-IN SELF TEST METHOD THEREOF

(71) Applicant: Winbond Electronics Corp., Taichung (TW)

(72) Inventor: Yuji Nakaoka, Kanagawa (JP)

(73) Assignee: Winbond Electronics Corp., Taichung (TW)

(*) Notice: Subject to any disclaimer, the term of this patent is extended or adjusted under 35 U.S.C. 154(b) by 63 days.

(21) Appl. No.: 16/671,194

(22) Filed: Nov. 1, 2019

(65) Prior Publication Data

US 2020/0152285 A1 May 14, 2020

(30) Foreign Application Priority Data

Nov. 9, 2018 (JP) .............................. JP2018-211065

(51) Int. Cl.
*G11C 29/14* (2006.01)
*G11C 5/14* (2006.01)
(Continued)

(52) U.S. Cl.
CPC ................ *G11C 29/14* (2013.01); *G11C 5/14* (2013.01); *G11C 7/222* (2013.01); *G11C 29/12005* (2013.01); *G11C 29/12015* (2013.01)

(58) Field of Classification Search
CPC ........... G11C 29/14; G11C 5/14; G11C 7/222; G11C 29/12005; G11C 29/12015
(Continued)

(56) References Cited

U.S. PATENT DOCUMENTS 5,315,554 A * 5/1994 Nanba .................... G11C 29/50
365/201
5,463,636 A * 10/1995 Nakayama ............. G11C 29/50
365/200
(Continued)

FOREIGN PATENT DOCUMENTS

CN 103295648 9/2013
CN 104412327 3/2015
(Continued)

OTHER PUBLICATIONS

"Office Action of Taiwan Counterpart Application," dated Jun. 28, 2019, p. 1-p. 5.
(Continued)

*Primary Examiner* — John J Tabone, Jr.
(74) *Attorney, Agent, or Firm* — JCIPRNET

(57) ABSTRACT

A memory device including a self-test circuit, a memory cell array, a power voltage generator, and a redundant row address replacement circuit is provided. The self-test circuit is configured to generate a self-test data signal and a power voltage control signal. The memory cell array receives the self-test data signal and outputs a self-test failure signal. The power voltage generator generates a word line power voltage according to a power voltage control signal. The redundant row address replacement circuit receives the word line power voltage and the self-test failure signal to provide a redundant word line address to the memory cell array. The power voltage generator is configured to provide the word line power voltage in a built-in self-test (BIST) mode to be lower than the word line power voltage in a normal mode.

20 Claims, 6 Drawing Sheets

(51) Int. Cl.
*G11C 29/12* (2006.01)
*G11C 7/22* (2006.01)

(58) Field of Classification Search
USPC ....... 714/721, 718, 719, 733, 734, 710, 742; 365/200, 201
See application file for complete search history.

(56) References Cited

U.S. PATENT DOCUMENTS

| | | | | |
|---|---|---|---|---|
| 5,563,546 | A * | 10/1996 | Tsukada | G11C 5/147 327/408 |
| 6,182,257 | B1 * | 1/2001 | Gillingham | G11C 29/08 714/718 |
| 7,298,658 | B2 | 11/2007 | Anazawa et al. | |
| 7,349,283 | B2 * | 3/2008 | Lindstedt | G11C 29/1201 365/189.011 |
| 9,368,236 | B2 * | 6/2016 | Ahn | G11C 29/38 |
| 2010/0246298 | A1 | 9/2010 | Zhang et al. | |
| 2012/0044777 | A1 | 2/2012 | Fujiwara et al. | |
| 2016/0349322 | A1 * | 12/2016 | Shibahara | G01R 31/3177 |
| 2017/0168109 | A1 * | 6/2017 | Kobashi | G06F 3/0653 |

FOREIGN PATENT DOCUMENTS

| | | |
|---|---|---|
| JP | H110241388 | 9/1998 |
| JP | 2002109899 | 4/2002 |
| JP | 2007157287 | 6/2007 |
| JP | 2009123168 | 6/2009 |
| JP | 2011521396 | 7/2011 |
| JP | 2011170950 | 9/2011 |
| JP | 2012205310 | 10/2012 |
| JP | 2013114728 | 6/2013 |
| JP | 2016038921 | 3/2016 |
| KR | 19990069337 | 9/1999 |
| KR | 20170030756 | 3/2017 |
| TW | I585772 | 6/2017 |

OTHER PUBLICATIONS

"Office Action of Japan Counterpart Application," dated Nov. 26, 2019, p. 1-p. 3.

"Office Action of Korea Counterpart Application," with partial English translation thereof, dated Dec. 4, 2019, p. 1-p. 11.

* cited by examiner

MEMORY DEVICE AND BUILT-IN SELF TEST METHOD THEREOF

CROSS-REFERENCE TO RELATED APPLICATION

This application claims the priority benefit of Japan application serial no. 2018-211065, filed on Nov. 9, 2018. The entirety of the above-mentioned patent application is hereby incorporated by reference herein and made a part of this specification.

BACKGROUND

Technical Field

The disclosure relates to a semiconductor device. More particularly, the disclosure relates to a memory device and a built-in self-test method thereof.

Description of Related Art

In a memory test, after initialization, failure bits detected by a built-in self-test (BIST) can be replaced through a parallel test mode by a redundant row array to improve the reliability of the memory. However, the conventional BIST adopts the power voltage and the sensing time applied in a normal operation, and thus it is rather difficult to detect the failure bits.

SUMMARY

The disclosure provides a memory device and a built-in self-test (BIST) method thereof to reduce a word line power voltage during the BIST and improve the detection rate of failure bits.

In an embodiment, a memory device including a self-test circuit, a memory cell array, a power voltage generator, and a redundant row address replacement circuit is provided. The self-test circuit is configured to generate a self-test data signal and a power voltage control signal. The memory cell array is coupled to the self-test circuit, receives the self-test data signal, and outputs a self-test failure signal. The power voltage generator is coupled to the self-test circuit and generates a word line power voltage according to the power voltage control signal. The redundant row address replacement circuit receives the word line power voltage and the self-test failure signal and provides a redundant word line address to the memory cell array. The power voltage generator is configured to provide the word line power voltage in a built-in self-test mode (BIST) to be lower than the word line power voltage in a normal mode.

In an embodiment, a built-in self-test method of a memory device is provided, and the memory device includes a memory cell array, a self-test circuit, a power voltage generator, and a redundant row address replacement circuit. The built-in self-test method includes steps of: generating, by the self-test circuit, a self-test data signal and a power voltage control signal; receiving, by the memory cell array, the self-test data and outputting a self-test failure signal; generating, by the power voltage generator, a word line power voltage according to the power voltage control signal; receiving, by the redundant row address replacement circuit, the word line power voltage and the self-test failure signal to provide a redundant word line address to the memory cell array. The word line power voltage in a BIST mode is lower than the word line power voltage in a normal mode.

In view of the above, according to one or more embodiments of the disclosure, the memory device in the BIST mode lowers the word line power voltage generated by the power voltage generator, so as to easily detect the failure bits and enhance reliability of the memory device.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles described herein.

DESCRIPTION OF THE EMBODIMENTS

Figure 1:
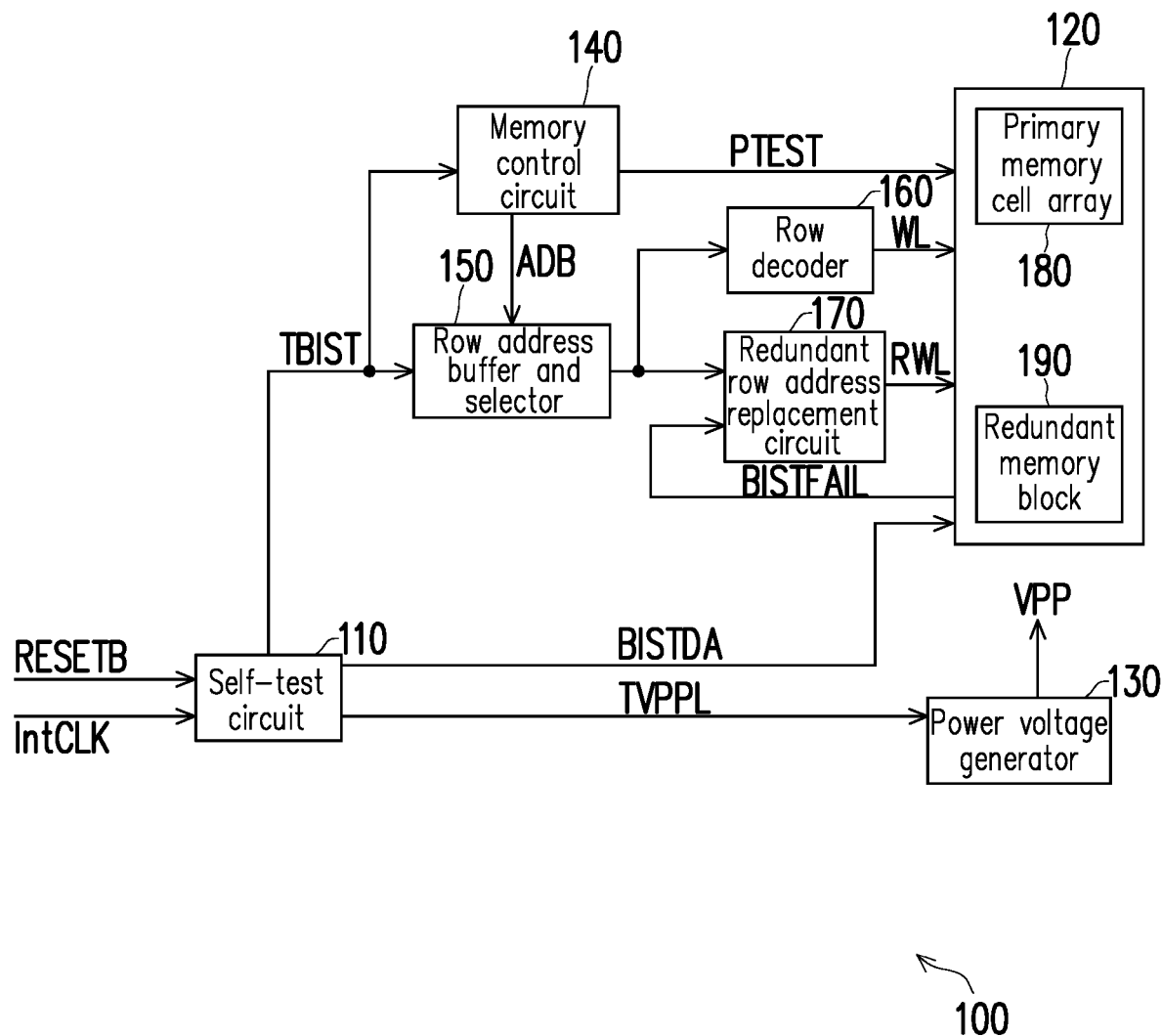
FIG. 1 is a schematic block view of a memory device according to an embodiment of the disclosure.

With reference to FIG. 1, in an embodiment, a memory device 100 includes a self-test circuit 110, a memory cell array 120, a power voltage generator 130, a memory control circuit 140, a row address buffer and selector 150, a row decoder 160, and a redundant row address replacement circuit 170. The self-test circuit 110 is configured to provide a self-test data signal BISTDA to the memory cell array 120 according to a reset signal RESETB and a clock signal IntCLK, provide a power voltage control signal TVPPL to the power voltage generator 130, and provide a built-in self-test (BIST) signal TBIST to the memory control circuit 140 and the row address buffer and selector 150. The memory cell array 120 includes a plurality of dynamic random access memory cells, and the type and the structure of the memory cell array 120 are not limited herein. The memory cell array 120 includes a primary memory cell array 180 and a redundant memory block 190, the redundant memory block 190 has redundant rows and redundant columns, and the redundant rows and the redundant columns have redundant memory cells configured to replace the failure or damaged memory cells in the primary memory cell array 180, so as to ensure the normal function of the memory device 100. The memory cell array 120 receives a self-test data signal BISTDA and provides a self-test failure signal BISTFAIL for indicating failure to the redundant row address replacement circuit 170. The redundant row address replacement circuit 170 can output a redundant word line address RWL according to the self-test failure signal BISTFAIL, so as to replace the detected failure word line address WL in the primary memory cell array 180 with the redundant word line address RWL in the redundant memory block 190. The power voltage generator 130 is coupled to the self-test circuit 110 and generates a word line power voltage VPP according to a power voltage control signal TVPPL. The row decoder 160 and the redundant row address replacement circuit 170 receive the word line power voltage VPP, so as to drive the row decoder 160 and the redundant row address replacement circuit 170 to output the word line address WL of the primary memory cell array 180 and the redundant word line address RWL, respectively. The memory control circuit 140 is coupled between the self-test circuit 110 and the memory cell array 120 and provides an address buffer control signal ADB and a test mode signal PTEST according to a BIST signal TBIST. The row address buffer and selector 150 receives the address buffer control signal ADB, so as to selectively adjust the potential of a row address signal (not shown). The memory cell array 120 receives the test mode signal PTEST and configures the memory cell array 120 to be in a normal mode or in a BIST mode according to the test mode signal PTEST.

In an embodiment, the memory device 100 may be configured to be in the normal mode or the BIST mode, and the word line power voltage VPP in the BIST mode is lower than the word line power voltage VPP in the normal mode. For instance, the power voltage generator 130 may set the word line power voltage VPP in the normal mode to be 2.9 V and the word line power voltage VPP in the BIST mode to be 2.7 V. In an embodiment, according to the reset signal RESETB at a high logic level, the memory device 100 is set to be in the BIST mode.

Figure 2:
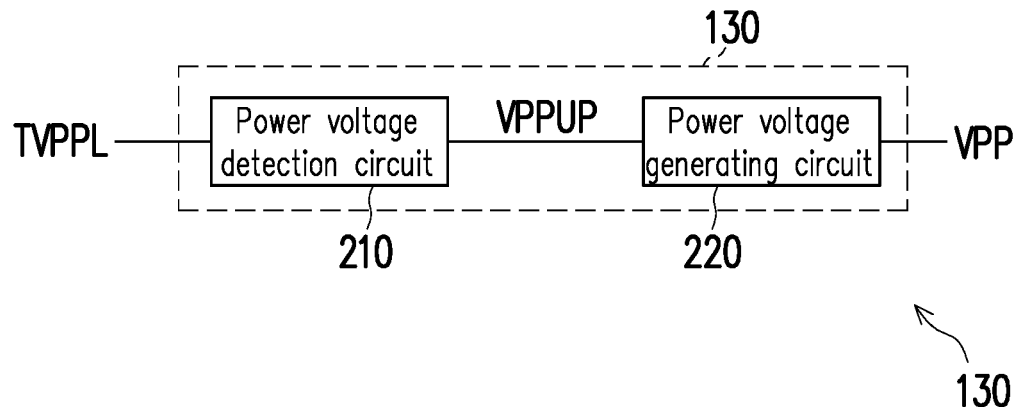
FIG. 2 is a schematic block view of a power voltage generator according to an embodiment of the disclosure.

With reference to FIG. 2, the power voltage generator 130 includes a power voltage detection circuit 210 and a power voltage generating circuit 220. The power voltage detection circuit 210 is coupled to the self-test circuit 110 and generates a power voltage adjusting signal VPPUP according to a power voltage control signal TVPPL provided by the self-test circuit 110. The power voltage generating circuit 220 receives the power voltage adjusting signal VPPUP to generate the word line power voltage VPP.

Figure 3:
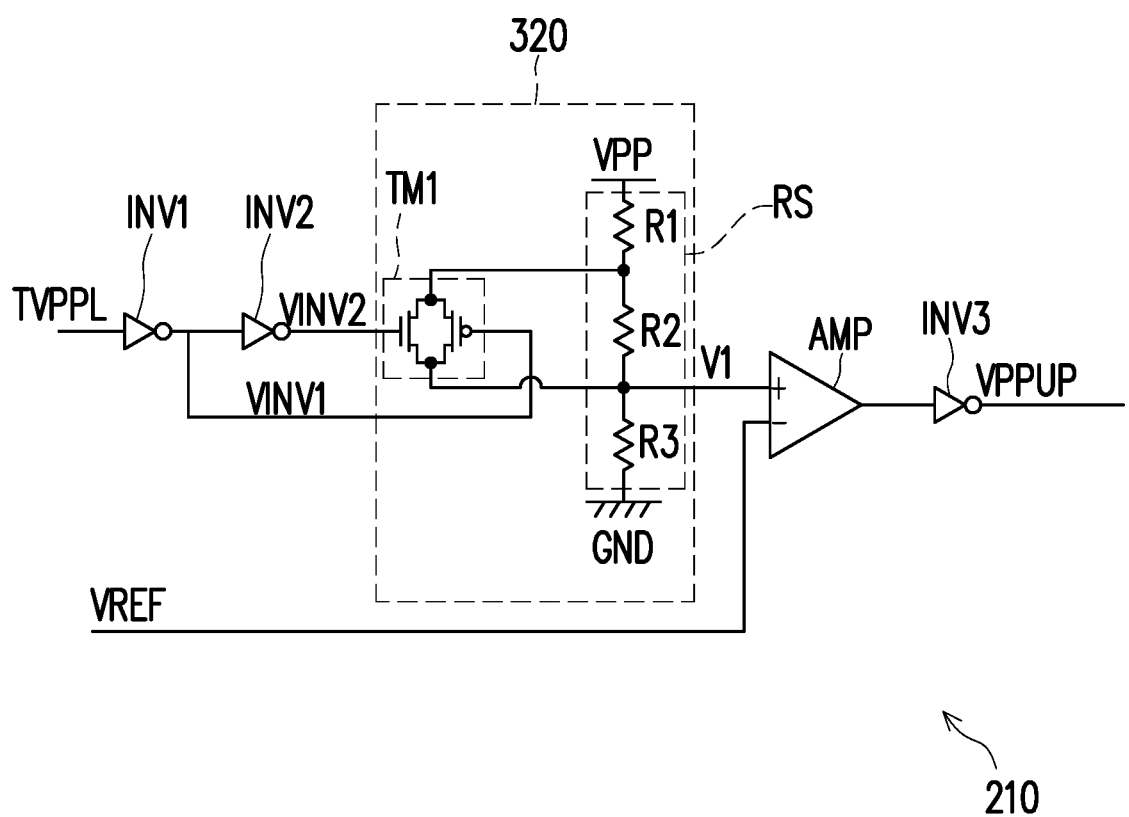
FIG. 3 illustrates schematic circuitry of a power voltage detection circuit according to an embodiment of the disclosure.

With reference to FIG. 3, the power voltage detection circuit 210 includes an inverter INV1, an inverter INV2, a voltage-dividing circuit 320, an amplifier AMP, and an inverter INV3. The inverter INV1 receives and inverts the power voltage control signal TVPP to generate a first control signal VINV1. The inverter INV2 is coupled to the inverter INV1 and configured to receive and invert the first control signal VINV1 to generate a second control signal VINV2. The voltage-dividing circuit 320 is coupled to the inverter INV2 and configured to divide the word line power voltage VPP according to the first control signal VINV1 and the second control signal VINV2 to generate a first voltage V1. The amplifier AMP is coupled to the voltage-dividing circuit 320 and receives the first voltage V1 and a reference voltage VREF. The amplifier AMP is configured to amplify a difference between the first voltage V1 and the reference voltage VREF to generate the power voltage adjusting signal VPPUP. The reference voltage VREF is a basis potential generated internally, and the reference voltage VREF can be set as 1.0 V.

In an embodiment, the voltage-dividing circuit 320 includes a transmission gate TM1 and a string of resistors RS, wherein the string of resistors includes a resistor R1, a resistor R2, and a resistor R3. In an embodiment, the resistor R1 can be configured to be equal to 1.7 times the resistor R3, and the resistor R2 can be configured to be 0.2 time the resistor R3. However, the amount of resistors and the relationship among the resistors are not limited thereto in the disclosure. The resistor R1, the resistor R2, and the resistor R3 can be serially connected and coupled between the word line power voltage VPP and a ground voltage GND for providing a voltage-dividing resistance to generate the first voltage V1. The transmission gate TM1 and at least one resistor of the string of resistors RS (e.g., the resistor R2) are connected in parallel. The transmission gate TM1 can be turned on or off according to the first control signal VINV1 and the second control signal VINV2, so as to adjust the voltage-dividing resistance for generating the first voltage V1.

For instance, when the first control signal VINV1 is at a low logic level, and the second control signal VINV2 is at a high logic level, the transmission gate TM1 is turned on to short-circuit two ends of the resistor R2; thereby, the voltage-dividing resistance is changed to raise the first voltage V1. By contrast, when the first control signal VINV1 is at the high logic level and the second control signal VINV2 is at the low logic level, the transmission gate TM1 is turned off; thereby, the voltage-dividing resistance is changed to lower the first voltage V1.

The amplifier AMP is coupled to the voltage-dividing circuit 320 and configured to amplify the difference between the first voltage V1 and the reference voltage VREF. In an embodiment, the amplifier AMP can further generate a power voltage adjusting signal VPPUP through the inverter INV3. Here, the amplifier can be an operating amplifier, and the type of the amplifier is not limited in the disclosure.

For instance, in the normal mode, the power voltage control signal TVPPL is at the low logic level, the transmission gate TM1 is turned off, and thus the resistor R2 should be taken into account. When the word line power voltage VPP is higher than or equal to 2.9 V, the first voltage V1 is higher than or equal to 1 V, the amplifier AMP outputs the high logic level, and the power voltage adjusting signal VPPUP is at the low logic level, so as to disable the power voltage generating circuit 220. When the word line power voltage VPP is lower than 2.9 V, the first voltage V1 is lower than 1 V, and the power voltage adjusting signal VPPUP is at the high logic level, so as to enable the power voltage generating circuit 220 and thereby raise the word line power voltage VPP to be equal to 2.9 V.

In the BIST mode, the power voltage control signal TVPPL is at a high logic level, the transmission gate TM1 is turned on, and thus the resistor R2 can be ignored. When the word line power voltage VPP is higher than or equal to 2.7V, the first voltage V1 is higher than or equal to 1 V, the amplifier AMP outputs the high logic level, and the power voltage adjusting signal VPPUP is at the low logic level, so as to disable the power voltage generating circuit 220. When the word line power voltage VPP is lower than 2.7 V, the first voltage V1 is lower than 1 V, and the power voltage adjusting signal VPPUP is at the high logic level, so as to enable the power voltage generating circuit 220 and thereby raise the word line power voltage VPP to be equal to 2.7 V.

Accordingly, in an embodiment, if the memory device 100 is configured to be in the normal mode, the power voltage generator 130 can set the word line power voltage VPP as 2.9 V. If the memory device 100 is configured to be in the BIST mode, the power voltage generator 130 can lower the word line power voltage VPP to 2.7 V.

Figure 4:
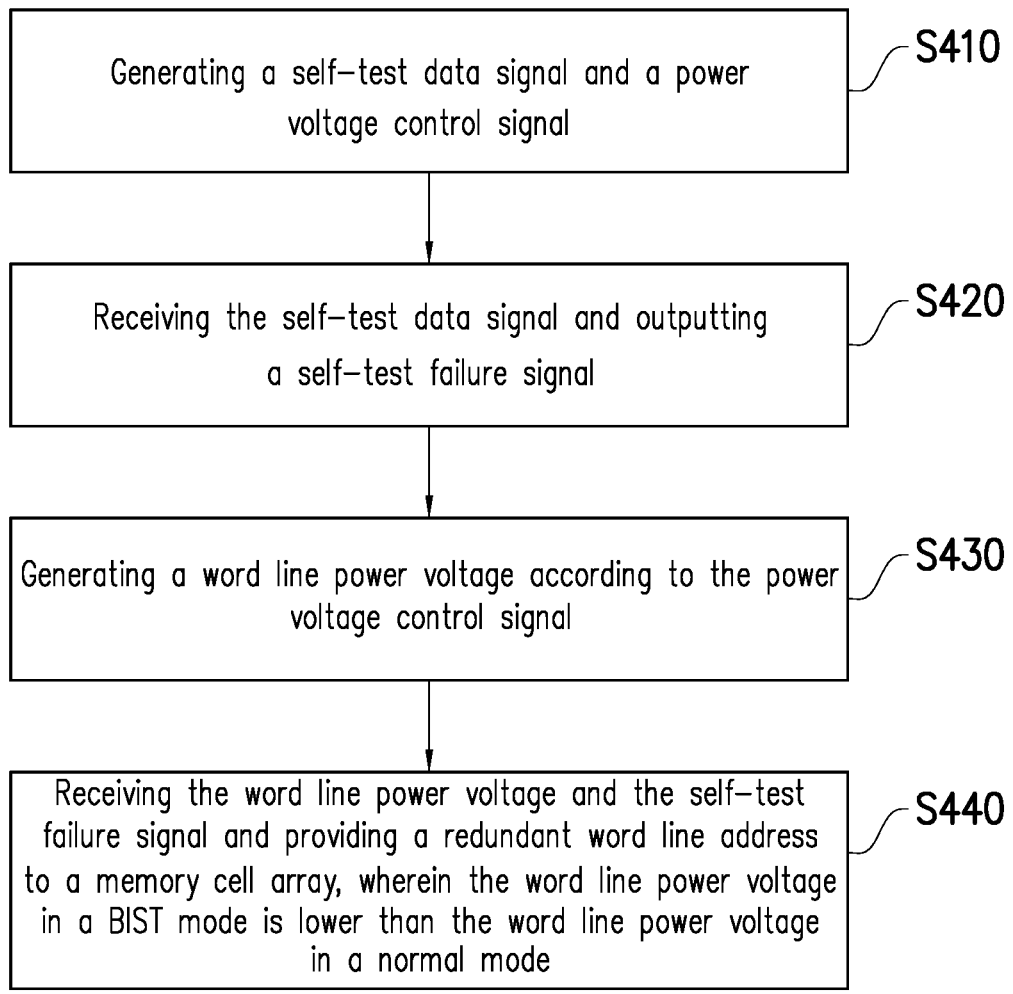
FIG. 4 is a flowchart of a built-in self-test (BIST) method according to an embodiment of disclosure.

With reference to FIG. 4, in step S410, a self-test circuit 110 generates a self-test data signal BISTDA and a power voltage control signal TVPPL. Next, in step S420, a memory cell array 120 receives the self-test data signal BISTDA and outputs a self-test failure signal BISTFAIL. In step S430, a power voltage generator 130 generates a word line power voltage VPP according to the power voltage control signal TVPPL. In step S440, a redundant row address replacement circuit 170 receives the word line power voltage VPP and the self-test failure signal BISTFAIL and provides a redundant word line address RWL to the memory cell array 120. Here, the word line power voltage VPP in a BIST mode is lower than the word line power voltage VPP in a normal mode.

Figure 5:
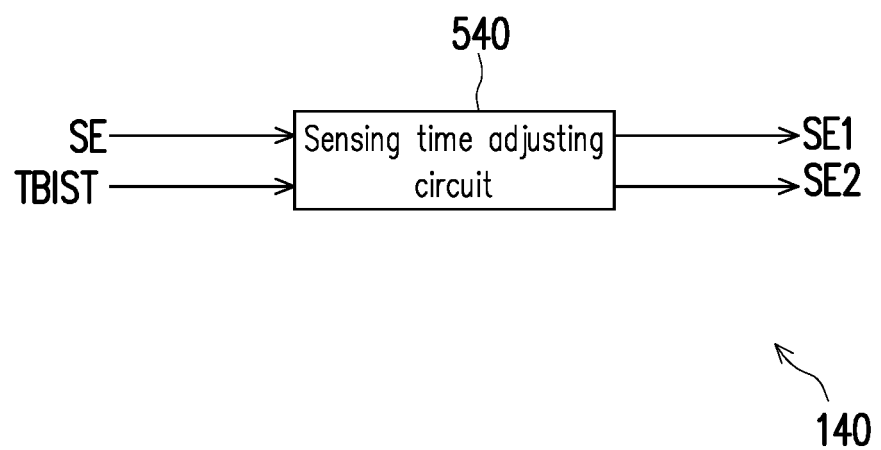
FIG. 5 is a schematic block view of a memory control circuit according to another embodiment of the disclosure.

Please refer to FIG. 5 and FIG. 1. FIG. 5 is a schematic block view of a memory control circuit according to another embodiment of the disclosure. In another embodiment, the memory control circuit 140 includes a sensing time adjusting circuit 540 configured to provide an adjusted sensing enabling signal SE1 and an adjusted sensing enabling signal SE2 to the memory cell array 120 according to the sensing enabling signal SE and BIST signal TBIST. Through the sensing time adjusting circuit 540, the sensing time of reading the memory cell array 120 in the BIST mode can be shorter than the sensing time in the normal mode. Here, the sensing time is the length of time required by changing the word line signal from the low logic level to the high logic level for accessing a selected word line address WL.

Figure 6:
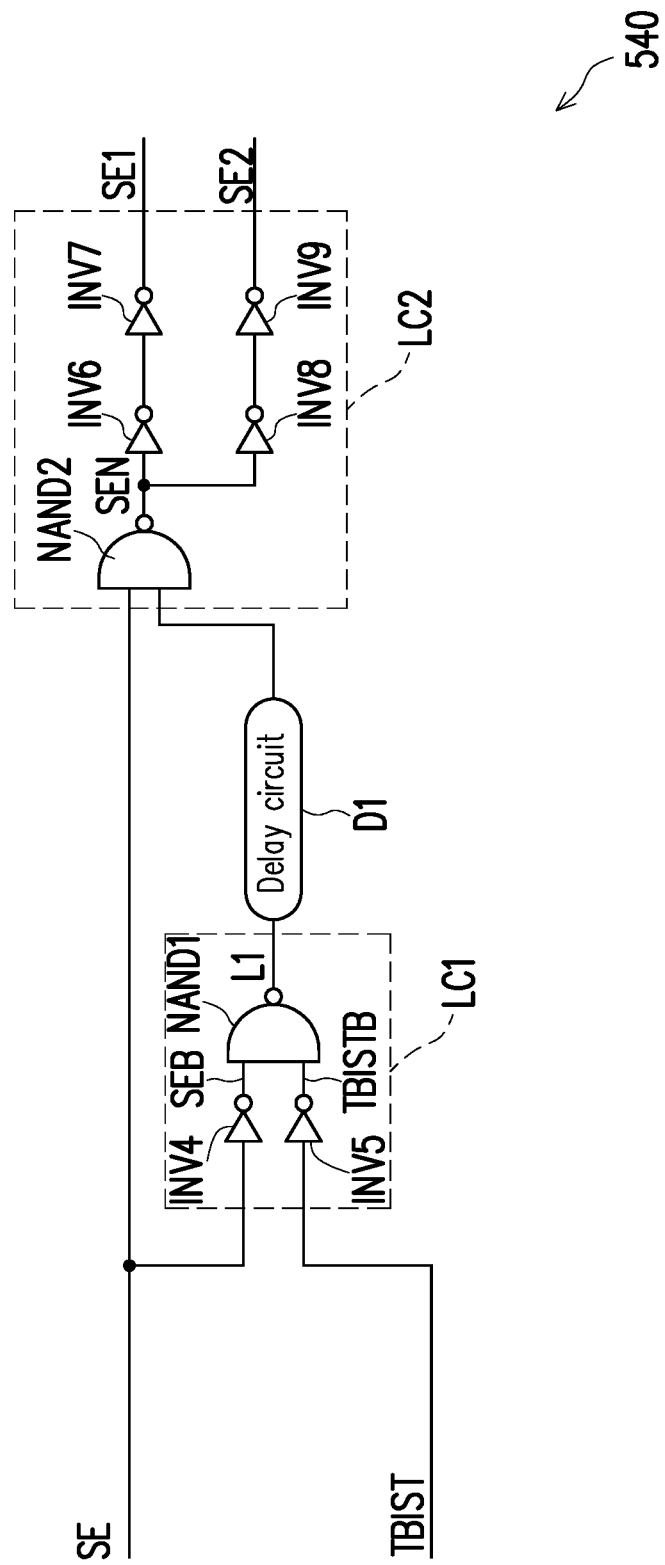
FIG. 6 illustrates schematic circuitry of a sensing time adjusting circuit according to an embodiment of the disclosure.

With reference to FIG. 6, the sensing time adjusting circuit 540 includes a first logic circuit LC1, a delay circuit D1, and a second logic circuit LC2. The first logic circuit LC1 performs a logic operation on the sensing enabling signal SE and the BIST signal TBIST to generate a first logic signal L1. The delay circuit D1 is coupled to the first logic circuit LC1 and configured to delay an output of the first logic signal L1 by 1 ns, for instance. An output of the delay circuit D1 is coupled to the second logic circuit LC2, and the second logic circuit LC2 performs a logic operation on the sensing enabling signal SE and the output of the delay circuit D1 to generate the adjusted sensing enabling signal SE1 and the adjusted sensing enabling signal SE2. Here, the adjusted sensing enabling signal SE1 and the adjusted sensing enabling signal SE2 are configured to adjust the sensing time.

In another embodiment, when the memory device 100 is configured to be in the normal mode, the sensing time adjusting circuit 540 delays the adjusted sensing enabling signal SE1 and the adjusted sensing enabling signal SE2. When the memory device 100 is configured to be in the BIST mode, the sensing time adjusting circuit 540 does not delay the adjusted sensing enabling signal SE1 and the adjusted sensing enabling signal SE2. Hence, when the memory device 100 is configured to be in the BIST mode, the transition time of the adjusted sensing enabling signals SE1 and SE2 generated by the sensing time adjusting circuit 540 is shorter than the transition time in the normal mode.

In another embodiment, the first logic circuit LC1 includes an inverter INV4, an inverter INV5, and an NAND gate NAND1. The inverter INV4 and the inverter INV5 respectively invert the sensing enabling signal SE and the BIST signal TBIST to generate an inverted sensing enabling signal SEB and an inverted BIST signal TBISTB. The NAND gate NAND1 is coupled to the outputs of the inverter INV4 and the inverter INV5 and configured to perform an NAND logic operation on the inverted sensing enabling signal SEB and the inverted BIST signal TBISTB to generate the first logic signal L1.

For instance, when the memory device 100 is configured to be in the normal mode, the BIST signal TBIST is at the low logic level (hereinafter referred to as 0), and thus the inverted BIST signal TBISTB is at the high logic level (hereinafter referred to as 1). When the sensing enabling signal SE is transited into 1 from 0, the inverted sensing enabling signal SEB is transited into 0 from 1, and the first logic signal L1 is transited into 1 from 0.

By contrast, when the memory device 100 is configured to be in the BIST mode, the BIST signal TBIST is 1; therefore, the inverted BIST signal TBISTB is 0, and thus the first logic signal L1 stays at 1. Since the first logic signal L1 stays at 1 and does not transit, the delay circuit D1 does not produce equivalent delay effects on the first logic signal L1.

The second logic circuit LC2 includes an NAND gate NAND2, an inverter INV6, an inverter INV7, an inverter INV8, and an inverter INV9. The NAND gate NAND2 is coupled to the delay circuit D1, and the NAND gate NAND2 is configured to perform the NAND logic operation on the outputs of the sensing enabling signal SE and the delay circuit D1, so as to generate an adjusted sensing enabling signal SEN. The inverter INV6 and the inverter INV7 are serially connected to act as a buffer and are coupled to the output of the NAND gate NAND2 and configured to receive the adjusted sensing enabling signal SEN, so as to generate an adjusted sensing enabling signal SE1. Similarly, the inverter INV8 and the inverter INV9 are serially connected to act as a buffer and are coupled to the output of the NAND gate NAND2 and configured to receive the adjusted sensing enabling signal SEN, so as to generate an adjusted sensing enabling signal SE2. Here, the adjusted sensing enabling signal SE2 and the adjusted sensing enabling signal SE1 are equal to the adjusted sensing enabling signal SEN.

For instance, when the memory device 100 is configured to be in the normal mode, the transition time of the first logic signal L1 is delayed by the delay circuit D1 (e.g., delayed by 1 ns); hence, the transition time of the adjusted sensing enabling signal SE1 and the adjusted sensing enabling signal SE2 is also delayed by 1 ns. By contrast, when the memory device 100 is configured to be in the BIST mode, the first logic signal L1 does not transit, and therefore the transition time of the adjusted sensing enabling signal SE1 and the adjusted sensing enabling signal SE2 is not delayed. Accordingly, in another embodiment, the sensing time of the memory device 100 configured to be in the BIST mode is shorter than that in the normal mode. In the BIST mode, the sensing time may be reduced by 1 ns than the sensing time in the normal mode.

Figure 7:
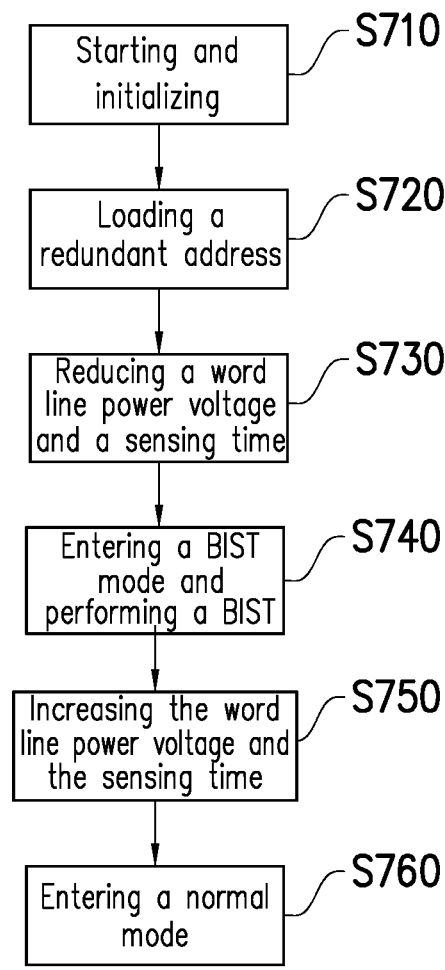
FIG. 7 is a flowchart of a BIST method according to another embodiment of the disclosure.

FIG. 7 is a flowchart of a BIST method according to another embodiment of the disclosure. In step S710, the memory device 100 starts and initializes signals and internal parameters in the memory device 100. In step S720, the memory device 100 loads a redundant address for providing a redundant memory address, so that the memory device 100 in the normal mode may replace the detected failure bits after the BIST mode ends. The redundant memory address includes a redundant word line address RWL. In step S730, the memory device 100 reduces the word line power voltage VPP and the sensing time, so as to deteriorate the test environment to allow the failure bits to be detected easily. Next, in step S740, the memory device 100 enters the BIST mode and performs a BIST. After the BIST is completed, in step S750, the memory device 100 increases the word line power voltage VPP and the sensing time to the voltage and the time applied in the normal mode. Thereafter, in step S760, the memory device returns to be in the normal mode.

To sum up, according to an embodiment of the disclosure, the memory device in the BIST mode lowers the word line power voltage generated by the power voltage generator, so as to easily detect the failure bits compared to the detection in the normal mode and enhance reliability of the memory device. What is more, in another embodiment of the disclosure, the memory device further includes the sensing time adjusting circuit configured to reduce the sensing time of reading the memory cell array in the BIST mode, so as to easily detect the failure bits and further enhance reliability of the memory device.

Although the disclosure has been provided with reference to the above embodiments, it will be apparent to one of ordinary skill in the art that modifications to the described embodiments may be made without departing from the spirit described herein. Accordingly, the protection scope will be defined by the attached claims and not by the above detailed descriptions.

What is claimed is:

1. A memory device, comprising:
a self-test circuit, configured to generate a self-test data signal and a power voltage control signal, the self-test circuit being activated according to a reset signal, so as to switch the memory device to a built-in self-test mode from a normal mode;
a memory cell array, coupled to the self-test circuit, receiving the self-test data signal, and outputting a self-test failure signal;
a power voltage generator, coupled to the self-test circuit and generating a word line power voltage according to the power voltage control signal; and
a redundant row address replacement circuit, receiving the word line power voltage and the self-test failure signal, and providing a redundant word line address to the memory cell array,
wherein the power voltage generator is configured to provide the word line power voltage in the built-in self-test mode to be lower than the word line power voltage in the normal mode.

2. The memory device according to claim 1, wherein the power voltage generator comprises:
a power voltage detection circuit, coupled to the self-test circuit and generating a power voltage adjusting signal according to the power voltage control signal; and
a power voltage generating circuit, coupled to the power voltage detection circuit and generating the word line power voltage according to the power voltage adjusting signal.

3. The memory device according to claim 2, further comprising:
a memory control circuit, coupled between the self-test circuit and the memory cell array, configured to receive a built-in self-test signal generated by the self-test circuit, and the memory control circuit comprising:
a sensing time adjusting circuit, configured to provide a first adjusted sensing enabling signal and a second adjusted sensing enabling signal to the memory cell array according to a sensing enabling signal and the built-in self-test signal, so that a sensing time of reading the memory cell array in the built-in self-test mode is shorter than that in the normal mode.

4. The memory device according to claim 3, wherein the sensing time adjusting circuit comprises:
a first logic circuit, configured to perform a first logic operation on the sensing enabling signal and the built-in self-test signal to generate a first logic signal;
a delay circuit, coupled to the first logic circuit and configured to delay an output of the first logic signal;
a second logic circuit, coupled to the delay circuit and configured to perform a second logic operation on the sensing enabling signal and an output of the delay circuit to generate the first adjusted sensing enabling signal and the second adjusted sensing enabling signal.

5. The memory device according to claim 3, wherein the power voltage detection circuit comprises:
a voltage-dividing circuit, dividing the word line power voltage according to the power voltage control signal to generate a first voltage; and
an amplifier, coupled to the voltage-dividing circuit and configured to amplify a difference between the first voltage and a reference voltage to generate the power voltage adjusting signal.

6. The memory device according to claim 5, wherein the voltage-dividing circuit comprises:
a string of resistors, configured to provide a voltage-dividing resistance;
a transmission gate, connected to at least one resistor of the string of resistors in parallel and adjusting the voltage-dividing resistance and the first voltage according to the power voltage control signal.

7. The memory device according to claim 5, wherein the sensing time adjusting circuit comprises:
a first logic circuit, configured to perform a first logic operation on the sensing enabling signal and the built-in self-test signal to generate a first logic signal;
a delay circuit, coupled to the first logic circuit and configured to delay an output of the first logic signal;
a second logic circuit, coupled to the delay circuit and configured to perform a second logic operation on the sensing enabling signal and an output of the delay circuit to generate the first adjusted sensing enabling signal and the second adjusted sensing enabling signal.

8. The memory device according to claim 6, wherein the power voltage detection circuit further comprises:
a first inverter, configured to invert the power voltage control signal to generate a first control signal; and
a second inverter, configured to invert the first control signal to generate a second control signal,
wherein the transmission gate receives the first control signal and the second control signal.

9. The memory device according to claim 8, wherein the sensing time adjusting circuit comprises:
a first logic circuit, configured to perform a first logic operation on the sensing enabling signal and the built-in self-test signal to generate a first logic signal;
a delay circuit, coupled to the first logic circuit and configured to delay an output of the first logic signal;
a second logic circuit, coupled to the delay circuit and configured to perform a second logic operation on the sensing enabling signal and an output of the delay circuit to generate the first adjusted sensing enabling signal and the second adjusted sensing enabling signal.

10. The memory device according to claim 2, wherein the power voltage detection circuit comprises:
a voltage-dividing circuit, dividing the word line power voltage according to the power voltage control signal to generate a first voltage; and
an amplifier, coupled to the voltage-dividing circuit and configured to amplify a difference between the first voltage and a reference voltage to generate the power voltage adjusting signal.

11. The memory device according to claim 10, wherein the voltage-dividing circuit comprises:
a string of resistors, configured to provide a voltage-dividing resistance;
a transmission gate, connected to at least one resistor of the string of resistors in parallel and adjusting the voltage-dividing resistance and the first voltage according to the power voltage control signal.

12. The memory device according to claim 11, wherein the power voltage detection circuit further comprises:
a first inverter, configured to invert the power voltage control signal to generate a first control signal; and
a second inverter, configured to invert the first control signal to generate a second control signal, wherein the transmission gate receives the first control signal and the second control signal.

13. The memory device according to claim 1, further comprising:
a memory control circuit, coupled between the self-test circuit and the memory cell array, configured to receive a built-in self-test signal generated by the self-test circuit, wherein the memory control circuit comprises:
a sensing time adjusting circuit, configured to provide a first adjusted sensing enabling signal and a second adjusted sensing enabling signal to the memory cell array according to a sensing enabling signal and the built-in self-test signal, so that a sensing time of reading the memory cell array in the built-in self-test mode is shorter than that in the normal mode.

14. The memory device according to claim 13, wherein the sensing time adjusting circuit comprises:
a first logic circuit, configured to perform a first logic operation on the sensing enabling signal and the built-in self-test signal to generate a first logic signal;
a delay circuit, coupled to the first logic circuit and configured to delay an output of the first logic signal;
a second logic circuit, coupled to the delay circuit and configured to perform a second logic operation on the sensing enabling signal and an output of the delay circuit to generate the first adjusted sensing enabling signal and the second adjusted sensing enabling signal.

15. A built-in self-test method of a memory device, the memory device comprising a memory cell array, a self-test circuit, a power voltage generator, and a redundant row address replacement circuit, the built-in self-test method comprising:
generating, by the self-test circuit, a self-test data signal and a power voltage control signal, so that the memory device is switched from a normal mode to a built-in self-test mode;
receiving, by the memory cell array, the self-test data signal and outputting a self-test failure signal;
generating, by the power voltage generator, a word line power voltage according to the power voltage control signal, the word line power voltage in the built-in self-test mode being lower than the word line power voltage in the normal mode; and
receiving, by the redundant row address replacement circuit, the word line power voltage and the self-test failure signal to provide a redundant word line address to the memory cell array.

16. The built-in self-test method according to claim 15, wherein steps of generating the word line power voltage comprise:
generating a power voltage adjusting signal according to the power voltage control signal; and
generating the word line power voltage according to the power voltage adjusting signal.

17. The built-in self-test method according to claim 16, further comprising:
adjusting a sensing time of reading the memory cell array, so that the sensing time in the built-in self-test mode is shorter than that in the normal mode.

18. The built-in self-test method according to claim 15, further comprising:
adjusting a sensing time of reading the memory cell array, so that the sensing time in the built-in self-test mode is shorter than that in the normal mode.

19. The built-in self-test method according to claim 18, wherein the step of adjusting the sensing time of reading the memory cell array further comprises:
performing a first logic operation on a sensing enabling signal and a built-in self-test signal generated by the self-test circuit to generate a first logic signal;
delaying an output of the first logic signal;
performing a second logic operation on the sensing enabling signal and the delayed output of the first logic signal to generate a first adjusted sensing enabling signal and a second adjusted sensing enabling signal; and
providing the first adjusted sensing enabling signal and the second adjusted sensing enabling signal to the memory cell array.

20. The built-in self-test method according to claim 18, wherein the step of adjusting the sensing time of reading the memory cell array further comprises:
performing a first logic operation on a sensing enabling signal and a built-in self-test signal generated by the self-test circuit to generate a first logic signal;
delaying an output of the first logic signal;
performing a second logic operation on the sensing enabling signal and the delayed output of the first logic signal to generate a first adjusted sensing enabling signal and a second adjusted sensing enabling signal; and
providing the first adjusted sensing enabling signal and the second adjusted sensing enabling signal to the memory cell array.

* * * * *